(12) United States Patent
Hoshino

(10) Patent No.: US 11,960,207 B2
(45) Date of Patent: Apr. 16, 2024

(54) RESIST COMPOSITION AND RESIST FILM

(71) Applicant: ZEON CORPORATION, Tokyo (JP)

(72) Inventor: Manabu Hoshino, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 930 days.

(21) Appl. No.: 16/963,831

(22) PCT Filed: Jan. 17, 2019

(86) PCT No.: PCT/JP2019/001207
§ 371 (c)(1),
(2) Date: Jul. 22, 2020

(87) PCT Pub. No.: WO2019/150966
PCT Pub. Date: Aug. 8, 2019

(65) Prior Publication Data
US 2021/0055654 A1 Feb. 25, 2021

(30) Foreign Application Priority Data
Feb. 5, 2018 (JP) .................... 2018-018504

(51) Int. Cl.
*G03F 7/027* (2006.01)
*C08F 212/08* (2006.01)
*C08F 220/22* (2006.01)
*C08F 265/06* (2006.01)
*G03F 7/033* (2006.01)
*G03F 7/039* (2006.01)

(52) U.S. Cl.
CPC ............ *G03F 7/027* (2013.01); *C08F 212/08* (2013.01); *C08F 220/22* (2013.01); *C08F 265/06* (2013.01); *G03F 7/033* (2013.01); *G03F 7/039* (2013.01)

(58) Field of Classification Search
CPC ........... G03F 7/039; G03F 7/027; G03F 7/033
See application file for complete search history.

(56) References Cited

U.S. PATENT DOCUMENTS

| 4,518,677 A * | 5/1985 | Pohl ..................... G03F 7/032 430/285.1 |
| 10,241,405 B2 | 3/2019 | Hoshino |
| 2001/0018166 A1 * | 8/2001 | Fujino ..................... G03F 7/325 430/311 |
| 2018/0024430 A1 | 1/2018 | Hoshino |

FOREIGN PATENT DOCUMENTS

| JP | H083636 B2 | 1/1996 |
| KR | 1020170120591 A | 10/2017 |
| WO | 9962964 A1 | 12/1999 |
| WO | 2016132722 A1 | 8/2016 |
| WO | 2017115622 A1 | 7/2017 |

OTHER PUBLICATIONS

Sep. 23, 2021, the Extended European Search Report issued by the European Patent Office in the corresponding European Patent Application No. 19746739.2.
Makoto Otani et al., Improvement of polymer type EB resist sensitivity and line edge roughness, Photomask and Next-Generation Lithography Mask Technology XVIII, Proc. of SPIE vol. 8081, 2011, pp. 808107-1 to 808107-8.
Aug. 11, 2020, International Preliminary Report on Patentability issued in the International Patent Application No. PCT/JP2019/001207.

* cited by examiner

*Primary Examiner* — John S Chu
(74) *Attorney, Agent, or Firm* — KENJA IP LAW PC

(57) ABSTRACT

Provided are a resist composition that can improve coatability (coating film formability) with respect to a substrate in spin coating and close adherence of a resist film and that can form a good pattern, and a resist film in which a good pattern is formed. The resist composition contains a polymer, a solvent, and an aromatic vinyl monomer, and has a content of the aromatic vinyl monomer relative to the polymer of not less than 10 mass ppm and not more than 30,000 mass ppm.

5 Claims, No Drawings

RESIST COMPOSITION AND RESIST FILM

TECHNICAL FIELD

The present disclosure relates to a resist composition and a resist film.

BACKGROUND

Polymers that display increased solubility in a developer after undergoing main chain scission through irradiation with ionizing radiation, such as an electron beam or extreme ultraviolet light (EUV), or short-wavelength light, such as ultraviolet light, are conventionally used as main chain scission-type positive resists in fields such as semiconductor production. (Hereinafter, the term "ionizing radiation or the like" is used to refer collectively to ionizing radiation and short-wavelength light.)

PTL (Patent Literature) 1 discloses one example of a main chain scission-type positive resist having high sensitivity. The disclosed positive resist comprises an α-methylstyrene-methyl α-chloroacrylate copolymer that includes an α-methylstyrene unit and a methyl α-chloroacrylate unit.

PTL 1 does not disclose a specific method of producing the methyl α-chloroacrylate-α-methylstyrene copolymer. In a specific production process of such a copolymer, a method has conventionally been adopted in which, after polymerization, a copolymer is isolated from the reaction mixture and is then repeatedly dissolved in an organic solvent and then caused to precipitate by dripping the resultant solution into a poor solvent so as to collect a purified copolymer. Electron beam resist compositions containing such a methyl α-chloroacrylate-α-methylstyrene copolymer have suffered from problems that contaminants tend to arise during dry etching treatment and defects readily form in a photomask.

Another problem is that in PTL 1, the positive resist comprising an α-methylstyrene-methyl α-chloroacrylate copolymer tends to suffer excessive film reduction even at low doses of irradiation by ionizing radiation or the like. Therefore, the positive resist comprising an α-methylstyrene-methyl α-chloroacrylate copolymer that is described in PTL 1 leaves room for improvement in terms of further reducing the film reduction rate at low doses of irradiation by ionizing radiation or the like.

In order to solve these problems, electron beam resist compositions that have a methyl α-chloroacrylate-α-methylstyrene copolymer as a resin component and for which contaminants do not arise during dry etching treatment have been studied (for example, refer to PTL 2), and positive resists having a low film reduction rate at low doses of irradiation by ionizing radiation or the like have also been studied (for example, refer to PTL 3).

CITATION LIST

Patent Literature

PTL 1: JP-H8-3636B
PTL 2: WO99/62964A1
PTL 3: WO2016/132722A1

SUMMARY

Technical Problem

However, the resist compositions described in PTL 2 and 3 leave room for improvement in terms of improving coatability (coating film formability) with respect to a substrate in spin coating and close adherence of a resist film, and also in terms of forming a good pattern.

Accordingly, one object of the present disclosure is to provide a resist composition that can improve coatability (coating film formability) with respect to a substrate in spin coating and close adherence of a resist film, and can also form a good pattern.

Another object of the present disclosure is to provide a resist film in which a good pattern is formed.

Solution to Problem

The inventor conducted diligent studies with the aim of solving the problems set forth above. The inventor discovered that when a resist composition contains a polymer, a solvent, and an aromatic vinyl monomer and when the content of the aromatic vinyl monomer relative to the polymer is not less than 10 mass ppm and not more than 30,000 mass ppm, the resist composition can improve coatability (coating film formability) with respect to a substrate in spin coating and close adherence of a resist film, and can form a good pattern. In this manner, the inventor completed the present disclosure.

Specifically, the present disclosure aims to advantageously solve the problems set forth above, and a presently disclosed resist composition comprises a polymer, a solvent, and an aromatic vinyl monomer, wherein content of the aromatic vinyl monomer relative to the polymer is not less than 10 mass ppm and less than 30,000 mass ppm. A resist composition that contains a polymer, a solvent, and an aromatic vinyl monomer and in which the content of the aromatic vinyl monomer relative to the polymer is not less than 10 mass ppm and less than 30,000 mass ppm can improve coatability (coating film formability) with respect to a substrate in spin coating and close adherence of a resist film, and can form a good pattern.

Note that the "content of the aromatic vinyl monomer relative to the polymer" referred to in the present disclosure can be determined through calculation using a chromatogram obtained by gas chromatography.

In the presently disclosed resist composition, the aromatic vinyl monomer is preferably an α-methylstyrene derivative. When the aromatic vinyl monomer is an α-methylstyrene derivative, coatability (coating film formability) with respect to a substrate in spin coating and close adherence of a resist film can be reliably improved, and a good pattern can be reliably formed.

It is preferable that the presently disclosed resist composition further comprises an α-halogeno(meth)acrylic acid ester monomer and that content of the α-halogeno(meth)acrylic acid ester monomer relative to the polymer is not less than 5 mass ppm and not more than 2,000 mass ppm. When the resist composition further contains an α-halogeno(meth)acrylic acid ester monomer and the content of the α-halogeno(meth)acrylic acid ester monomer relative to the polymer is not less than 5 mass ppm and not more than 2,000 mass ppm, coatability (coating film formability) with respect to a substrate in spin coating and close adherence of a resist film can be further improved, and an even better pattern can be formed.

Note that the "content of the α-halogeno(meth)acrylic acid ester monomer relative to the polymer" referred to in the present disclosure can be determined through calculation using a chromatogram obtained by gas chromatography.

In the presently disclosed resist composition, the polymer preferably includes an α-methylstyrene monomer unit and a methyl α-chloroacrylate monomer unit. When the polymer includes an α-methylstyrene monomer unit and a methyl α-chloroacrylate monomer unit, coatability (coating film formability) with respect to a substrate in spin coating and close adherence of a resist film can be reliably improved, and a good pattern can be reliably formed.

Moreover, the present disclosure aims to advantageously solve the problems set forth above, and a presently disclosed resist film is formed on a substrate using any one of the resist compositions set forth above. By forming a resist film on a substrate using any one of the resist compositions set forth above, a resist film in which a good pattern is formed can be obtained.

Advantageous Effect

Through the presently disclosed resist composition, it is possible to improve coatability (coating film formability) with respect to a substrate in spin coating and close adherence of a resist film, and to form a good pattern.

Moreover, through the presently disclosed resist film, a good pattern is formed.

DETAILED DESCRIPTION

The following provides a detailed description of embodiments of the present disclosure.

The presently disclosed resist composition can be well used as a positive resist.

(Resist Composition)

The presently disclosed resist composition contains a polymer, a solvent, and an aromatic vinyl monomer, and optionally further contains an α-halogeno(meth)acrylic acid ester monomer and known additives that can be used in resist compositions. As a result of the presently disclosed resist composition containing the polymer as a resist, a high-resolution pattern can be well formed using a resist film obtained through application and drying of the presently disclosed resist composition.

<Polymer>

The polymer may, without any specific limitations, be a copolymer including an aromatic vinyl monomer unit and an α-halogeno(meth)acrylic acid ester monomer unit, a copolymer including an aromatic vinyl monomer unit and a (meth)acrylic acid ester monomer unit, a homopolymer composed of a (meth)acrylic acid ester monomer unit, a homopolymer composed of an aromatic vinyl monomer unit, a homopolymer composed of an α-halogeno(meth)acrylic acid ester monomer unit, or the like, for example. One of these polymers may be used individually, or two or more of these polymers may be used in combination in a freely selected ratio.

Of these polymers, a copolymer including an aromatic vinyl monomer unit and an α-halogeno(meth)acrylic acid ester monomer unit and a homopolymer composed of a (meth)acrylic acid ester monomer unit are preferable, and a copolymer including an aromatic vinyl monomer unit and an α-halogeno(meth)acrylic acid ester monomer unit is more preferable.

<<Aromatic Vinyl Monomer Unit>>

An aromatic vinyl monomer unit is a repeating unit that is derived from a vinyl aromatic. When the polymer includes an aromatic vinyl monomer unit, the polymer can display excellent dry etching resistance through the protective stability of an aromatic compound when the polymer is used as a resist.

Note that the polymer preferably includes an aromatic vinyl monomer unit in a proportion of not less than 30 mol % and not more than 70 mol %.

The aromatic vinyl monomer unit may, without any specific limitations, be an α-methylstyrene monomer unit, an α-methylnaphthalene monomer unit, a benzyl methacrylate monomer unit, a styrene monomer unit, or the like, for example. One of these types of aromatic vinyl monomer units may be used individually, or two or more of these types of aromatic vinyl monomer units may be used in combination in a freely selected ratio.

Of these aromatic vinyl monomer units, an α-methylstyrene monomer unit is preferable.

—α-Methylstyrene Monomer Unit—

An α-methylstyrene monomer unit is a structural unit that is derived from α-methylstyrene. When the polymer includes an α-methylstyrene monomer unit, the polymer can display excellent dry etching resistance through protective stability of a benzene ring when the polymer is used as a resist.

Note that the polymer preferably includes an α-methylstyrene monomer unit in a proportion of not less than 30 mol % and not more than 70 mol %.

<<α-Halogeno(Meth)Acrylic Acid Ester Monomer Unit>>

An α-halogeno(meth)acrylic acid ester monomer unit is a structural unit that is derived from an α-halogeno(meth)acrylic acid ester. When the polymer includes an α-halogeno(meth)acrylic acid ester monomer unit, a halogen atom is eliminated from the polymer and the polymer readily undergoes main chain scission through a β-cleavage reaction upon irradiation with ionizing radiation or the like. Consequently, a resist formed of the polymer displays high sensitivity.

Note that the polymer preferably includes an α-halogeno(meth)acrylic acid ester monomer unit in a proportion of not less than 30 mol % and not more than 70 mol %.

The α-halogeno(meth)acrylic acid ester monomer unit may, without any specific limitations, be an α-chloroacrylic acid ester monomer unit such as a methyl α-chloroacrylate monomer unit, an ethyl α-chloroacrylate monomer unit, a benzyl α-chloroacrylate monomer unit, a 1-adamantyl α-chloroacrylate monomer unit, a 2,2,3,3,3-pentafluoropropyl α-chloroacrylate monomer unit, or a 2,2,3,3,4,4,4-heptafluorobutyl α-chloroacrylate monomer unit, or the like, for example. One of these types of α-halogeno(meth)acrylic acid ester monomer units may be used individually, or two or more of these types of α-halogeno(meth)acrylic acid ester monomer units may be used in combination in a freely selected ratio.

Of these α-halogeno(meth)acrylic acid ester monomer units, a methyl α-chloroacrylate monomer unit is preferable.

—Methyl α-Chloroacrylate Monomer Unit—

A methyl α-chloroacrylate monomer unit is a structural unit that is derived from methyl α-chloroacrylate. When the polymer includes a methyl α-chloroacrylate monomer unit, a chlorine atom is eliminated from the polymer and the polymer readily undergoes main chain scission through a β-cleavage reaction upon irradiation with ionizing radiation or the like. Consequently, a resist formed of the polymer displays high sensitivity.

Note that the polymer preferably includes a methyl α-chloroacrylate monomer unit in a proportion of not less than 30 mol % and not more than 70 mol %.

When the polymer includes a structural unit (methyl α-chloroacrylate unit) derived from methyl α-chloroacrylate having a chloro group (—Cl) at the α-position, the polymer readily undergoes main chain scission to lower molecular weight upon irradiation with ionizing radiation or the like (for example, an electron beam, a KrF laser, an ArF laser, or an EUV laser).

<<(Meth)Acrylic Acid Ester Monomer Unit>>

A (meth)acrylic acid ester monomer unit is a structural unit that is derived from a (meth)acrylic acid ester, and, in the present specification, is considered to not be inclusive of the previously described "methyl α-chloroacrylate monomer unit". When the polymer includes a (meth)acrylic acid ester monomer unit, a high-molecular weight product can easily be obtained.

The (meth)acrylic acid ester monomer unit may, without any specific limitations, be a methyl methacrylate (MMA) monomer unit, an ethyl methacrylate monomer unit, a benzyl methacrylate monomer unit, or the like, for example. One of these types of (meth)acrylic acid ester monomer units may be used individually, or two or more of these types of (meth)acrylic acid ester monomer units may be used in combination in a freely selected ratio.

Of these (meth)acrylic acid ester monomer units, a methyl methacrylate (MMA) monomer unit is preferable.

—Methyl Methacrylate (MMA) Monomer Unit—

A methyl methacrylate (MMA) monomer unit is a structural unit that is derived from methyl methacrylate (MMA). When the polymer includes a methyl methacrylate (MMA) monomer unit, a high-molecular weight product can easily be obtained, and the polymer can be dissolved in a solvent.

<<Weight-Average Molecular Weight>>

The weight-average molecular weight (Mw) of the polymer is preferably 50,000 or more, more preferably 55,000 or more, and particularly preferably 60,000 or more, and is preferably 500,000 or less, more preferably 350,000 or less, even more preferably 100,000 or less, particularly preferably 85,000 or less, and most preferably 73,000 or less. The film reduction rate at low irradiation doses can be further reduced when the weight-average molecular weight (Mw) of the polymer is 50,000 or more, whereas the polymer can be well used as a resist having excellent characteristics such as sensitivity when the weight-average molecular weight (Mw) of the polymer is 500,000 or less.

Note that "weight-average molecular weight (Mw)" referred to in the present specification can be measured by gel permeation chromatography.

<<Number-Average Molecular Weight>>

The number-average molecular weight (Mn) of the polymer is preferably 25,000 or more, more preferably 30,000 or more, and even more preferably 42,000 or more, and is preferably 100,000 or less, more preferably 76,000 or less, and particularly preferably 51,000 or less. The film reduction rate at low irradiation doses can be further reduced when the number-average molecular weight (Mn) of the polymer is 25,000 or more, whereas the polymer can be well used as a resist having excellent characteristics such as sensitivity when the number-average molecular weight (Mn) of the polymer is 100,000 or less.

Note that "number-average molecular weight (Mn)" referred to in the present specification can be measured by gel permeation chromatography.

<<Molecular Weight Distribution>>

The molecular weight distribution (Mw/Mn) of the polymer is preferably less than 1.48, more preferably 1.47 or less, and particularly preferably 1.43 or less, and is preferably 1.20 or more. The polymer can be well used as a resist having excellent characteristics such as γ value when the molecular weight distribution (Mw/Mn) thereof is less than 1.48 and is easy to produce when the molecular weight distribution (Mw/Mn) thereof is 1.20 or more.

Note that "molecular weight distribution (Mw/Mn)" referred to in the present specification is the ratio of the weight-average molecular weight (Mw) relative to the number-average molecular weight (Mn).

<<Production Method of Polymer>>

The polymer having the properties set forth above can be produced, for example, by carrying out polymerization of a monomer composition that contains an aromatic vinyl monomer, such as α-methylstyrene, and an α-halogeno (meth)acrylic acid ester monomer, such as methyl α-chloroacrylate, and purifying the obtained polymer.

The composition, molecular weight distribution, weight-average molecular weight, and number-average molecular weight of the polymer, and the proportions of components having various molecular weights in the polymer can be adjusted by altering the polymerization conditions and the purification conditions. In one specific example, the weight-average molecular weight and the number-average molecular weight can be reduced by raising the polymerization temperature. In another specific example, the weight-average molecular weight and the number-average molecular weight can be reduced by shortening the polymerization time.

—Polymerization of Monomer Composition—

The monomer composition used in production of the polymer may be a mixture containing monomers, a solvent, a polymerization initiator, and optionally added additives. Polymerization of the monomer composition may be carried out by a known method. In particular, aromatic vinyl monomers such as α-methylstyrene, α-halogeno(meth)acrylic acid ester monomers such as methyl α-chloroacrylate, (meth)acrylic acid ester monomers such as methyl methacrylate (MMA), and the like are preferable as the monomers, cyclopentanone (CPN) or the like is preferable as the solvent, and radical polymerization initiators such as azobisisobutyronitrile are preferable as the polymerization initiator.

The composition of the polymer can be adjusted by altering the proportion in which each monomer is contained in the monomer composition used in polymerization. The proportion of high-molecular weight components contained in the polymer can be adjusted by altering the amount of the polymerization initiator. For example, the proportion of high-molecular weight components can be increased by reducing the amount of the polymerization initiator.

A polymerized product obtained through polymerization of the monomer composition may, without any specific limitations, be collected by adding a good solvent such as tetrahydrofuran to a solution containing the polymerized product and subsequently dripping the solution to which the good solvent has been added into a poor solvent such as methanol or a mixed solvent of tetrahydrofuran and methanol to coagulate the polymerized product, and then the polymerized product may be purified as described below.

<<Purification of Polymerized Product>>

The purification method used to purify the resultant polymerized product to obtain the polymer having the properties set forth above may be, but is not specifically limited to, a known purification method such as reprecipitation or column chromatography. Of these purification methods, purification by reprecipitation is preferable.

Note that purification of the polymerized product may be performed repeatedly.

Purification of the polymerized product by reprecipitation can be carried out by, for example, dissolving the obtained polymerized product in a good solvent such as tetrahydrofuran, and subsequently dripping the resultant solution into (i) a poor solvent such as methanol or (ii) a mixed solvent of a good solvent, such as tetrahydrofuran, and a poor solvent, such as methanol, to cause precipitation of a portion of the polymerized product. By purifying the polymerized product through dripping of a solution of the polymerized product into a mixed solvent of a good solvent and a poor solvent in this manner, it is easy to adjust the content ratio of monomers remaining in the obtained polymerized product (i.e., residual monomers) and the molecular weight distribution, weight-average molecular weight, number-average molecular weight, and proportion of low-molecular weight components in the obtained polymerized product by altering (i) the number of repetitions of purification by reprecipitation, (ii) the types of good solvent and poor solvent, (iii) the mixing ratio of good solvent and poor solvent, and so forth. Specifically, the content ratio of residual monomers can be reduced by increasing the number of repetitions of purification by reprecipitation, and the molecular weight of polymer that precipitates in the mixed solvent can be increased by increasing the proportion of the good solvent in the mixed solvent.

Also note that in a situation in which the polymerized product is purified by reprecipitation, polymer that precipitates in the mixed solvent of the good solvent and the poor solvent may be used as the polymer that is contained in the presently disclosed resist composition, or polymer that does not precipitate in the mixed solvent (i.e., polymer dissolved in the mixed solvent) may be used as the polymer that is contained in the presently disclosed resist composition. Polymer that does not precipitate in the mixed solvent can be collected from the mixed solvent by a known technique such as concentration to dryness.

<Solvent>

The solvent in the presently disclosed resist composition can be any known solvent in which the above-described polymer is soluble, and examples thereof include THF, anisole, cyclopentanone, and methyl 3-methoxypropionate. One of these solvents may be used individually, or two or more of these solvents may be used in combination in a freely selected ratio.

Of these examples, methyl 3-methoxypropionate is preferably used as the solvent from a viewpoint of obtaining a resist composition having appropriate viscosity and improving coatability of the resist composition.

<Aromatic Vinyl Monomer>

The aromatic vinyl monomer in the presently disclosed resist composition may, without any specific limitations, be an α-methylstyrene derivative such as α-methylstyrene monomer or 4-fluoro-α-methylstyrene; a methacrylate derivative such as benzyl methacrylate or adamantyl methacrylate; a styrene derivative such as styrene or 4-fluorostyrene; α-methylnaphthalene monomer; or the like, for example. One of these aromatic vinyl monomers may be used individually, or two or more of these aromatic vinyl monomers may be used in combination in a freely selected ratio.

Of these aromatic vinyl monomers, α-methylstyrene derivatives are preferable in terms that the content ratio in a polymer during polymerization can easily be adjusted, with α-methylstyrene monomer being more preferable.

The content of the aromatic vinyl monomer relative to the polymer is not specifically limited so long as it is not less than 10 mass ppm and not more than 30,000 mass ppm, but is preferably 600 mass ppm or more, and more preferably 1,000 mass ppm or more from a viewpoint of coatability (coating film formability) of the resist composition, and is preferably 30,000 mass ppm or less, more preferably 10,000 mass ppm or less, even more preferably 3,700 mass ppm or less, and particularly preferably 2,000 mass ppm or less from a viewpoint of bridging defect resistance, pattern collapse resistance, and γ value (pattern clarity) of a formed resist pattern.

<α-Halogeno(Meth)Acrylic Acid Ester Monomer>

The α-halogeno(meth)acrylic acid ester monomer in the presently disclosed resist composition may, without any specific limitations, be an α-chloroacrylic acid ester monomer such as methyl α-chloroacrylate monomer, ethyl α-chloroacrylate, benzyl α-chloroacrylate, 1-adamantyl α-chloroacrylate, 2,2,3,3,3-pentafluoropropyl α-chloroacrylate, or 2,2,3,3,4,4,4-heptafluorobutyl α-chloroacrylate; an α-fluoroacrylic acid ester monomer such as methyl α-fluoroacrylate monomer, ethyl α-fluoroacrylate, benzyl α-fluoroacrylate, 1-adamantyl α-fluoroacrylate, 2,2,3,3,3-pentafluoropropyl α-fluoroacrylate, or 2,2,3,3,4,4,4-heptafluorobutyl α-fluoroacrylate; or the like, for example. One of these α-halogeno(meth)acrylic acid ester monomers may be used individually, or two or more of these α-halogeno(meth)acrylic acid ester monomers may be used in combination in a freely selected ratio.

Of these α-halogeno(meth)acrylic acid ester monomers, α-chloroacrylic acid ester monomers are preferable in terms of main chain scission efficiency and ease of polymerization, with methyl α-chloroacrylate monomer being more preferable.

The content of the α-halogeno(meth)acrylic acid ester monomer relative to the polymer is not specifically limited, but is preferably 5 mass ppm or more, more preferably 200 mass ppm or more, and particularly preferably 300 mass ppm or more from a viewpoint of close adherence of the resist composition, and is preferably 2,000 mass ppm or less, particularly preferably 1,000 mass ppm or less, and most preferably 600 mass ppm or less from a viewpoint of pattern collapse resistance and γ value (pattern clarity) of a formed resist pattern.

(Resist Film)

The presently disclosed resist film is formed on a substrate using the presently disclosed resist composition.

The thickness of the presently disclosed resist film is not specifically limited, but is preferably 20 nm or more, and more preferably 30 nm or more from a viewpoint of etching resistance, and is preferably 200 nm or less, and more preferably 100 nm or less from a viewpoint of micro-wiring formation.

<Substrate>

The material of the substrate may, without any specific limitations, be silicon, quartz, chromium, molybdenum, or the like, for example. One of these materials may be used individually, or two or more of these materials may be used in combination in a freely selected ratio.

<Resist Film Formation Method>

The method by which the resist film is formed is not specifically limited and may, for example, be a method in which the resist composition is applied onto a base plate using a spin coater, and then the applied resist composition is heated for a specific time, to reach a specific temperature, so as to form a resist film on the base plate.

EXAMPLES

The following provides a more specific description of the present disclosure based on examples. However, the present disclosure is not limited to the following examples. In the following description, "%", "ppm", and "parts" used to express quantities are by mass unless otherwise specified.

In the examples and comparative examples, the following methods were used to measure and evaluate the number-average molecular weight (Mn) of a polymer (after reprecipitation purification) and a polymerized product (after precipitation purification operation and before reprecipitation purification), the weight-average molecular weight (Mw) of a polymer and a polymerized product, the molecular weight distribution (Mw/Mn) of a polymer and a polymerized product, the content of a residual monomer (α-methylstyrene (AMS) or methyl α-chloroacrylate (ACAM)) relative to a polymer or polymerized product (Comparative Example 1), the coatability (coating film formability) of a resist composition, the close adherence of a resist film formed using a resist composition, the bridging defect resistance of a resist pattern, the pattern collapse resistance of a resist pattern, and the γ value (pattern clarity) of a resist pattern.

<Number-Average Molecular Weight, Weight-Average Molecular Weight, and Molecular Weight Distribution>

The number-average molecular weight (Mn) and the weight-average molecular weight (Mw) of a polymer or a polymerized product were measured by gel permeation chromatography, and then the molecular weight distribution (Mw/Mn) of the polymer or polymerized product was calculated. The results are shown in Tables 1 and 2.

Specifically, the number-average molecular weight (Mn) and the weight-average molecular weight (Mw) of a polymer or a polymerized product were determined as values in terms of standard polystyrene using a gel permeation chromatograph (HLC-8220 produced by Tosoh Corporation) with tetrahydrofuran as a developing solvent. The molecular weight distribution (Mw/Mn) was then calculated.

Content of Residual Monomer (α-Methylstyrene (AMS) and Methyl α-Chloroacrylate (ACAM)) Relative to Polymer or Polymerized Product (Comparative Example 1)

The concentrations of residual monomers (α-methylstyrene (AMS) and methyl α-chloroacrylate (ACAM)) in a resist solution (positive resist composition) in which the concentration of a polymer or polymerized product (Comparative Example 1) was 1 mass % were measured by gas chromatography, and the content of each residual monomer (α-methylstyrene (AMS) or methyl α-chloroacrylate (ACAM)) relative to the polymer or polymerized product (Comparative Example 1) was calculated. The results are shown in Tables 1 and 2.

Specifically, the concentrations of residual monomers (α-methylstyrene (AMS) and methyl α-chloroacrylate (ACAM)) in a resist solution (positive resist composition) in which the concentration of a polymer or polymerized product (Comparative Example 1) was 1 mass % were measured using a gas chromatograph (produced by Shimadzu Corporation; product name: GC-2010AF/AOC, 100V).

<Coatability (Coating Film Formability) of Resist Composition>

A resist composition in which the concentration of a polymer or polymerized product (Comparative Example 1) was 2% was filtered through a filter having a pore diameter of 0.45 μm (product name: DISMIC; producer: Advantec Toyo Kaisha, Ltd.).

The filtrate was then applied onto a silicon wafer of 4 inches in diameter serving as a base plate using a spin coater (MS-A150 produced by Mikasa Co., Ltd.). Note that this application was performed under conditions of 3 seconds at 300 rpm and 57 seconds at 1,800 rpm (room temperature 23° C.). After application, a hot-plate was used to perform a prebake for 3 minutes at 180° C. to form a resist film.

Thereafter, coatability (coating film formability) of the resist composition was evaluated by the following evaluation standard through visual inspection of the surface of the resist film that has been formed on the silicon wafer. The results are shown in Tables 1 and 2.

<<Evaluation Standard>>
  A: Coating film can be formed and no defects arise
  B: Coating film can be formed but defects arise in a small amount that is of a permissible level
  C: Coating film cannot be formed or defects arise in a large amount that is not of a permissible level <Close Adherence of Resist Film>

A resist composition in which the concentration of a polymer or polymerized product (Comparative Example 1) was 2% was filtered through a filter having a pore diameter of 0.45 μm (product name: DISMIC; producer: Advantec Toyo Kaisha, Ltd.).

The filtrate was then applied onto a silicon wafer of 4 inches in diameter serving as a base plate using a spin coater (MS-A150 produced by Mikasa Co., Ltd.). Note that this application was performed under conditions of 3 seconds at 300 rpm and 57 seconds at 1,800 rpm (room temperature 23° C.). After application, a hot-plate was used to perform a prebake for 3 minutes at 180° C. to form a resist film.

Thereafter, close adherence of the resist film and the silicon wafer was evaluated by the following evaluation standard. The results are shown in Tables 1 and 2.

<<Evaluation Standard>>
  A: No peeling occurs even after 10 minutes of immersion of the resist film (coating film) in a resist developer ZED-N50 (produced by Zeon Corporation)
  B: Slight peeling occurs after 10 minutes of immersion of the resist film (coating film) in a resist developer ZED-N50 (produced by Zeon Corporation) but is of a permissible level
  C: Substantial peeling occurs after 10 minutes of immersion of the resist film (coating film) in a resist developer ZED-N50 (produced by Zeon Corporation) and is not of a permissible level <Bridging Defect Resistance of Resist Pattern>

A resist composition in which the concentration of a polymer or polymerized product (Comparative Example 1) was 2% was filtered through a filter having a pore diameter of 0.45 μm (product name: DISMIC; producer: Advantec Toyo Kaisha, Ltd.).

A spin coater (MS-A150 produced by Mikasa Co., Ltd.) was used to apply the filtrate onto a silicon wafer of 4 inches in diameter such as to have a thickness of 50 nm. The applied filtrate (resist composition) was heated for 3 minutes by a hot-plate at a temperature of 180° C. to form a resist film on the silicon wafer. An electron beam writer (ELS-S50 produced by Elionix Inc.) was used to write a pattern through exposure of the resist film to an optimal exposure dose (Eop). Development treatment was subsequently performed for 1 minute at a temperature of 23° C. using ZED-N50 (produced by Zeon Corporation) as a resist developer. Thereafter, 10 seconds of immersion was performed in resist rinsing liquid isopropanol, and then drying by blowing was performed to form a resist pattern. The formed resist pattern was inspected for bridging defects. Note that the optimal exposure dose (Eop) was set as appropriate with a value approximately double Eth as a rough guide. Moreover, lines (non-exposed regions) and spaces (exposed regions) of the resist pattern were each set as 25 nm.

Bridging defect resistance was evaluated in accordance with the following standard. The results are shown in Tables 1 and 2.
- A: No bridging defects are observed per unit area (1 μm²) after patterning
- B: A few bridging defects are observed per unit area (1 μm²) after patterning but are of a permissible level
- C: Roughly 10 or more bridging defects are observed per unit area (1 μm²) after patterning and are not of a permissible level <Pattern Collapse Resistance of Resist Film>

A resist composition in which the concentration of a polymer or polymerized product (Comparative Example 1) was 2% was filtered through a filter having a pore diameter of 0.45 μm (product name: DISMIC; producer: Advantec Toyo Kaisha, Ltd.).

A spin coater (MS-A150 produced by Mikasa Co., Ltd.) was used to apply the filtrate onto a silicon wafer of 4 inches in diameter such as to have a thickness of 50 nm. The applied filtrate (resist composition) was heated for 3 minutes by a hot-plate at a temperature of 180° C. to form a resist film on the silicon wafer. An electron beam writer (ELS-S50 produced by Elionix Inc.) was used to write a pattern through exposure of the resist film to an optimal exposure dose (Eop). Development treatment was subsequently performed for 1 minute at a temperature of 23° C. using ZED-N50 (produced by Zeon Corporation) as a resist developer. Thereafter, 10 seconds of immersion was performed in resist rinsing liquid isopropanol, and then drying by blowing was performed to form a resist pattern. The occurrence of pattern collapse of the formed resist pattern was inspected. Note that the optimal exposure dose (Eop) was set as appropriate with a value approximately double Eth as a rough guide. Moreover, lines (non-exposed regions) and spaces (exposed regions) of the resist pattern were each set as 25 nm.

Pattern collapse resistance was evaluated in accordance with the following standard. The results are shown in Tables 1 and 2.
- A: No pattern collapse observed per unit area (1 μm²) after patterning
- B: Pattern collapse observed at a few locations per unit area (1 μm²) after patterning but is of a permissible level
- C: Pattern collapse observed at roughly 10 or more locations per unit area (1 μm²) after patterning and is not of a permissible level <γ Value (Pattern Clarity) of Resist Pattern>

A resist composition in which the concentration of a polymer or polymerized product (Comparative Example 1) was 2% was filtered through a filter having a pore diameter of 0.45 μm (product name: DISMIC; producer: Advantec Toyo Kaisha, Ltd.).

A spin coater (MS-A150 produced by Mikasa Co., Ltd.) was used to apply the filtrate onto a silicon wafer of 4 inches in diameter such as to have a thickness of 500 nm. The applied filtrate (resist composition) was heated for 3 minutes by a hot-plate at a temperature of 180° C. to form a resist film on the silicon wafer. An electron beam writer (ELS-S50 produced by Elionix Inc.) was used to write a plurality of patterns (dimensions: 500 μm×500 μm) over the resist film with different electron beam irradiation doses, and development treatment was carried out for 1 minute at a temperature of 23° C. using ZED-N50 (produced by Zeon Corporation). Thereafter, 10 seconds of immersion was performed in resist rinsing liquid isopropanol, and then drying by blowing was performed to process the resist film. The electron beam irradiation dose was varied in a range of 4 μC/cm² to 200 μC/cm² in increments of 4 μC/cm². Next, an optical film thickness meter (Lambda Ace produced by Dainippon Screen Mfg. Co., Ltd.) was used to measure the thickness of the resist film in regions in which writing had been performed. A sensitivity curve was prepared that indicated a relationship between the common logarithm of the total electron beam irradiation dose and the remaining film fraction of the resist film after development (=thickness of resist film after development/thickness of resist film formed on silicon wafer). The γ value was calculated using the formula shown below with respect to the obtained sensitivity curve (horizontal axis: common logarithm of total electron beam irradiation dose; vertical axis: remaining film fraction of resist film (0 remaining film fraction 1.00)). In the following formula, $E_0$ is the logarithm of the total irradiation dose obtained when the sensitivity curve is fitted to a quadratic function in a range from a remaining film fraction of 0.20 to a remaining film fraction of 0.80, and then a remaining film fraction of 0 is substituted with respect to the obtained quadratic function (function of remaining film fraction and common logarithm of total irradiation dose). Also, $E_1$ is the logarithm of the total irradiation dose obtained when a straight line is prepared that joins points on the obtained quadratic function corresponding to remaining film fractions of 0 and 0.50 (linear approximation for gradient of sensitivity curve), and then a remaining film fraction of 1.00 is substituted with respect to the obtained straight line (function of remaining film fraction and common logarithm of total irradiation dose). The following formula expresses the gradient of the straight line between a remaining film fraction of 0 and a remaining film fraction of 1.00.

$$\gamma = \left|\log_{10}\left(\frac{E_1}{E_0}\right)\right|^{-1}$$

The γ value was evaluated in accordance with the following standard. A larger γ value indicates that the sensitivity curve has a larger gradient and that a high-clarity (high-resolution) pattern can be better formed. The results are shown in Tables 1 and 2.
- A: Pattern has square edges after patterning and can be formed extremely clearly (γ value of 8.0 or more)
- B: Pattern has slightly rounded edges after patterning but can be formed clearly (γ value of not less than 7.0 and less than 8.0)
- C: Pattern has rounded edges after patterning and becomes extremely unclear (γ value of less than 7.0)

Example 1

<Production of Polymer>

[Polymerization of Monomer Composition]

A monomer composition (monomer concentration: 40 mass %) containing 10.00 g of methyl α-chloroacrylate (ACAM) and 22.93 g of α-methylstyrene (AMS) as monomers, 49.45 g of cyclopentanone (CPN) as a solvent, and 0.0364 g of azobisisobutyronitrile (AIBN) as a polymerization initiator was loaded into a glass container. The glass container was tightly sealed and purged with nitrogen, and was then stirred for 48 hours in a 75° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution.

The solution to which 10 g of THF had been added was then dripped into 100 g of methanol to cause precipitation of a polymerized product, and the solution containing the polymerized product that had precipitated was subsequently filtered using a Kiriyama funnel to obtain a white coagulated material (polymerized product) (i.e., a "precipitation purification operation" in Table 1 was performed once). The obtained polymerized product had a number-average molecular weight (Mn) of 29,000, a weight-average molecular weight (Mw) of 55,000, and a molecular weight distribution (Mw/Mn) of 1.85.

[Reprecipitation Purification of Polymerized Product]

Next, the obtained polymerized product was dissolved in 10 g of THF, the resultant solution was dripped into 100 g of methanol (MeOH), and precipitated solid content was separated by filtration, the obtained solid content was then dissolved in 10 g of THF, and the resultant solution was dripped into 100 g of methanol (MeOH) (i.e., reprecipitation purification of dripping a THF solution into methanol ("reprecipitation purification 2" in Table 1) was performed twice) to cause precipitation of a white coagulated material (polymer comprising α-methylstyrene units and methyl α-chloroacrylate units). Thereafter, the solution containing the polymer that had precipitated was filtered using a Kiriyama funnel to obtain a white polymer. The weight-average molecular weight of the polymer, the number-average molecular weight of the polymer, and the molecular weight distribution of the polymer were measured. The results are shown in Table 1.

<Production of Resist Composition>

The obtained polymer was dissolved in THF as a solvent to produce a resist solution (positive resist composition) in which the concentration of the polymer was 1 mass %. The content (mass ppm) of α-methylstyrene (AMS) relative to the polymer and the content (mass ppm) of methyl α-chloroacrylate (ACAM) relative to the polymer were measured. The results are shown in Table 1.

Example 2

"Production of a polymer" and "production of a resist composition" were performed in the same way as in Example 1 with the exception that "reprecipitation purification of a polymerized product" was performed as described below. Measurements and evaluations were also performed in the same way as in Example 1. The results are shown in Table 1.

[Reprecipitation Purification of Polymerized Product]

The obtained polymerized product was subsequently dissolved in 10 g of THF, the resultant solution was dripped into 100 g of methanol (MeOH), and precipitated solid content was separated by filtration, the obtained solid content was then dissolved in 10 g of THF, and the resultant solution was dripped into 100 g of methanol (MeOH) (i.e., reprecipitation purification of dripping a THF solution into methanol ("reprecipitation purification 2" in Table 1) was performed twice) to cause precipitation of a white coagulated material (polymer comprising α-methylstyrene units and methyl α-chloroacrylate units). Next, the obtained polymerized product was dissolved in 10 g of THF to produce a solution of 10 mass % in concentration (relative to solvent) (i.e., "production of THF solution of 10 mass % in concentration" in Table 1 was performed), and the obtained solution was dripped into a mixed solvent of 60 g of THF and 40 g of methanol (MeOH) (i.e., reprecipitation purification of dripping a THF solution into a mixed solvent ("reprecipitation purification 1" in Table 1) was performed once) to cause precipitation of a white coagulated material (polymer comprising α-methylstyrene units and methyl α-chloroacrylate units). Thereafter, the solution containing the polymer that had precipitated was filtered using a Kiriyama funnel to obtain a white polymer.

The obtained polymer was dissolved in 10 g of THF, and the resultant solution was dripped into 100 g of methanol (MeOH) (i.e., reprecipitation purification of dripping a THF solution into methanol ("reprecipitation purification 2" in Table 1) was performed one more time (3 times in total)) to cause precipitation of a white coagulated material (polymer comprising α-methylstyrene units and methyl α-chloroacrylate units). Thereafter, the solution containing the polymer that had precipitated was filtered using a Kiriyama funnel to obtain a white polymer. The weight-average molecular weight of the polymer, the number-average molecular weight of the polymer, and the molecular weight distribution of the polymer were measured. The results are shown in Table 1.

Example 3

"Production of a polymer" and "production of a resist composition" were performed in the same way as in Example 1 with the exception that "polymerization of a monomer composition" and "reprecipitation purification of a polymerized product" were performed as described below. Measurements and evaluations were also performed in the same way as in Example 1. The results are shown in Table 1.

[Polymerization of Monomer Composition]

A monomer composition (monomer concentration: 80 mass %) containing 10.00 g of methyl α-chloroacrylate (ACAM) and 22.93 g of α-methylstyrene (AMS) as monomers, 8.25 g of cyclopentanone (CPN) as a solvent, and 0.0364 g of azobisisobutyronitrile (AIBN) as a polymerization initiator was loaded into a glass container. The glass container was tightly sealed and purged with nitrogen, and was then stirred for 6 hours in a 78° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which 10 g of THF had been added was dripped into 100 g of methanol to cause precipitation of a polymerized product, and the solution containing the polymerized product that had precipitated was subsequently filtered using a Kiriyama funnel to obtain a white coagulated material (polymerized product) (i.e., a "precipitation purification operation" in Table 1 was performed once). The obtained polymerized product had a number-average molecular weight (Mn) of 27,000, a weight-average molecular weight (Mw) of 45,000, and a molecular weight distribution (Mw/Mn) of 1.68.

[Reprecipitation Purification of Polymerized Product]

Next, the obtained polymerized product was dissolved in 10 g of THF to produce a solution of 10 mass % in concentration (relative to solvent) (i.e., "production of THF solution of 10 mass % in concentration" in Table 1 was performed), and the obtained solution was dripped into a mixed solvent of 60 g of THF and 40 g of methanol (MeOH) (i.e., reprecipitation purification of dripping a THF solution into a mixed solvent ("reprecipitation purification 1" in Table 1) was performed once) to cause precipitation of a white coagulated material (polymer comprising α-methylstyrene units and methyl α-chloroacrylate units). Thereafter, the solution containing the polymer that had precipitated was filtered using a Kiriyama funnel to obtain a white polymer.

The obtained polymer was dissolved in 10 g of THF, and the resultant solution was dripped into 100 g of methanol (MeOH) (i.e., reprecipitation purification of dripping a THF solution into methanol ("reprecipitation purification 2" in Table 1) was performed once) to cause precipitation of a white coagulated material (polymer comprising α-methylstyrene units and methyl α-chloroacrylate units). Thereafter, the solution containing the polymer that had precipitated was filtered using a Kiriyama funnel to obtain a white polymer. The weight-average molecular weight of the polymer, the number-average molecular weight of the polymer, and the molecular weight distribution of the polymer were measured. The results are shown in Table 1.

Example 4

"Production of a polymer" and "production of a resist composition" were performed in the same way as in Example 2 with the exception that "polymerization of a monomer composition" was performed as described below, and a "mixed solvent of 63.5 g of THF and 36.5 g of methanol (MeOH)" was used instead of using a "mixed solvent of 60 g of THF and 40 g of methanol (MeOH)" in "reprecipitation purification 1" of "reprecipitation purification of a polymerized product" in Example 2. Measurements and evaluations were also performed in the same way as in Example 2. The results are shown in Table 1.

[Polymerization of Monomer Composition]

A monomer composition (monomer concentration: 100 mass %) containing 10.00 g of methyl α-chloroacrylate (ACAM) and 22.93 g of α-methylstyrene (AMS) as monomers, and 0.0273 g of azobisisobutyronitrile (AIBN) as a polymerization initiator was loaded into a glass container. The glass container was tightly sealed and purged with nitrogen, and was then stirred for 48 hours in a 75° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which 10 g of THF had been added was dripped into 100 g of methanol to cause precipitation of a polymerized product, and the solution containing the polymerized product that had precipitated was subsequently filtered using a Kiriyama funnel to obtain a white coagulated material (polymerized product) (i.e., a "precipitation purification operation" in Table 1 was performed once). The obtained polymerized product had a number-average molecular weight (Mn) of 32,000, a weight-average molecular weight (Mw) of 56,000, and a molecular weight distribution (Mw/Mn) of 1.76.

Example 5

"Production of a polymer" and "production of a resist composition" were performed in the same way as in Example 3 with the exception that "polymerization of a monomer composition" was performed as described below, and a "mixed solvent of 65.5 g of THF and 34.5 g of methanol (MeOH)" was used instead of using a "mixed solvent of 60 g of THF and 40 g of methanol (MeOH)" in "reprecipitation purification 1" of "reprecipitation purification of a polymerized product" in Example 3. Measurements and evaluations were also performed in the same way as in Example 3. The results are shown in Table 1.

[Polymerization of Monomer Composition]

A monomer composition (monomer concentration: 100 mass %) containing 10.00 g of methyl α-chloroacrylate (ACAM) and 22.93 g of α-methylstyrene (AMS) as monomers, and 0.0091 g of azobisisobutyronitrile (AIBN) as a polymerization initiator was loaded into a glass container. The glass container was tightly sealed and purged with nitrogen, and was then stirred for 8 hours in a 78° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which 10 g of THF had been added was then dripped into 100 g of methanol to cause precipitation of a polymerized product, and the solution containing the polymerized product that had precipitated was subsequently filtered using a Kiriyama funnel to obtain 18.26 g of a white coagulated material (polymerized product) (i.e., a "precipitation purification operation" in Table 1 was performed once). The obtained polymerized product had a number-average molecular weight (Mn) of 39,000, a weight-average molecular weight (Mw) of 72,000, and a molecular weight distribution (Mw/Mn) of 1.84.

Example 6

"Production of a polymer" and "production of a resist composition" were performed in the same way as in Example 5 with the exception that a "mixed solvent of 66 g of THF and 34 g of methanol (MeOH)" was used instead of using a "mixed solvent of 65.5 g of THF and 34.5 g of methanol (MeOH)" in "reprecipitation purification 1" of "reprecipitation purification of a polymerized product" in Example 5. Measurements and evaluations were also performed in the same way as in Example 5. The results are shown in Table 1.

Example 7

"Production of a polymer" and "production of a resist composition" were performed in the same way as in Example 3 with the exception that "polymerization of a monomer composition" was performed as described below, and a "mixed solvent of 50 g of THF and 50 g of methanol (MeOH)" was used instead of using a "mixed solvent of 60 g of THF and 40 g of methanol (MeOH)" in "reprecipitation purification 1" of "reprecipitation purification of a polymerized product" in Example 3. Measurements and evaluations were also performed in the same way as in Example 3. The results are shown in Table 1.

[Polymerization of Monomer Composition]

A monomer composition (monomer concentration: 80 mass %) containing 10.00 g of methyl α-chloroacrylate (ACAM) and 22.93 g of α-methylstyrene (AMS) as monomers, 8.31 g of cyclopentanone (CPN) as a solvent, and 0.2909 g of azobisisobutyronitrile (AIBN) as a polymerization initiator was loaded into a glass container. The glass container was tightly sealed and purged with nitrogen, and was then stirred for 6.5 hours in a 78° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which 10 g of THF had been added was dripped into 100 g of methanol to cause precipitation of a polymerized product, and the solution containing the polymerized product that had precipitated was subsequently filtered using a Kiriyama funnel to obtain a white coagulated material (polymerized product) (i.e., a "precipitation purification operation" in Table 1 was performed once). The obtained polymerized product had a number-average molecular weight (Mn) of 12,000, a weight-average molecular weight (Mw) of 17,000, and a molecular weight distribution (Mw/Mn) of 1.46.

Example 8

"Production of a polymer" and "production of a resist composition" were performed in the same way as in Example 1 with the exception that "polymerization of a monomer composition" and "reprecipitation purification of a polymerized product" were performed as described below. Measurements and evaluations were also performed in the same way as in Example 1. The results are shown in Table 1.

[Polymerization of Monomer Composition]

Emulsion polymerization was performed as described in Synthesis Example 1 of WO99/62964A1. The following provides a detailed description.

A separable flask was charged with 2,750 parts (61.1 g) of pure water, 3 g of sodium carbonate, and 225 parts (5 g) of KORR-18 (product name; produced by Kao Corporation; aqueous solution of potassium soap of partially hydrogenated tallow fatty acid having solid content of 17.5% to 18.5%), and these materials were dissolved. Next, 450 parts (10 g) of methyl α-chloroacrylate and 1,084 parts (24.1 g) of α-methylstyrene were added, and emulsification was performed under vigorous stirring. The inside of the flask was purged with nitrogen, 0.4 parts (0.009 g) of sodium dithionate, 0.15 parts (0.003 g) of ethylenediaminetetraacetic acid tetrasodium salt trihydrate, 0.375 parts (0.008 g) of ethylenediaminetetraacetic acid tetrasodium salt tetrahydrate, 0.225 parts (0.005 g) of sodium formaldehyde sulfoxylate, and 0.786 parts (0.017 g) of cumene hydroperoxide were subsequently added in order, and then 48 hours of stirring was performed at 5° C. After adding 7.5 parts (0.17 g) of 2,6-di-tert-butyl-4-methylphenol to terminate the reaction, the glass container was restored to room temperature, the inside of the glass container was opened to the atmosphere, and then 66.7 g of tetrahydrofuran (THF) was added to the resultant solution. The solution to which 66.7 g of THF had been added was dripped into 311.1 g of methanol to cause precipitation of a polymerized product, and the solution containing the polymerized product that had precipitated was subsequently filtered using a Kiriyama funnel to obtain a white coagulated material (polymerized product) (i.e., a "precipitation purification operation" in Table 1 was performed once). The obtained polymerized product had a number-average molecular weight (Mn) of 169,000, a weight-average molecular weight (Mw) of 342,000, and a molecular weight distribution (Mw/Mn) of 2.02.

[Reprecipitation Purification of Polymerized Product]

Next, the obtained polymerized product was dissolved in 66.7 g of THF, the resultant solution was dripped into 311.1 g of methanol (MeOH), and precipitated solid content was separated by filtration, the obtained solid content was then dissolved in 66.7 g of THF, the resultant solution was dripped into 311.1 g of methanol (MeOH), and precipitated solid content was separated by filtration, the obtained solid content was then dissolved in 66.7 g of THF, the resultant solution was dripped into 311.1 g of methanol (MeOH), and precipitated solid content was separated by filtration, and the obtained solid content was then dissolved in 66.7 g of THF, and the resultant solution was dripped into 311.1 g of methanol (MeOH) (i.e., reprecipitation purification of dripping a THF solution into methanol ("reprecipitation purification 2" in Table 1) was performed 4 times) to cause precipitation of a white coagulated material (polymer comprising α-methylstyrene units and methyl α-chloroacrylate units). Thereafter, the solution containing the polymer that had precipitated was filtered using a Kiriyama funnel to obtain a white polymer. The weight-average molecular weight of the polymer, the number-average molecular weight of the polymer, and the molecular weight distribution of the polymer were measured. The results are shown in Table 1.

Example 9

"Production of a polymer" and "production of a resist composition" were performed in the same way as in Example 8 with the exception that "reprecipitation purification of a polymerized product" was performed as described below. Measurements and evaluations were also performed in the same way as in Example 8. The results are shown in Table 1.

[Reprecipitation Purification of Polymerized Product]

The obtained polymerized product was subsequently dissolved in 66.7 g of THF, the resultant solution was dripped into 311.1 g of methanol (MeOH), and precipitated solid content was separated by filtration, the obtained solid content was then dissolved in 66.7 g of THF, the resultant solution was dripped into 311.1 g of methanol (MeOH), and precipitated solid content was separated by filtration, the obtained solid content was then dissolved in 66.7 g of THF, the resultant solution was dripped into 311.1 g of methanol (MeOH), and precipitated solid content was separated by filtration, and the obtained solid content was then dissolved in 66.7 g of THF, and the resultant solution was dripped into 311.1 g of methanol (MeOH) (i.e., reprecipitation purification of dripping a THF solution into methanol ("reprecipitation purification 2" in Table 1) was performed 4 times) to cause precipitation of a white coagulated material (polymer comprising α-methylstyrene units and methyl α-chloroacrylate units). Next, the obtained polymerized product was dissolved in 10 g of THF to produce a solution of 10 mass % in concentration (relative to solvent) (i.e., "production of THF solution of 10 mass % in concentration" in Table 1 was performed), and the obtained solution was dripped into a mixed solvent of 68.5 g of THF and 31.5 g of methanol (MeOH) (i.e., reprecipitation purification of dripping a THF solution into a mixed solvent ("reprecipitation purification 1" in Table 1) was performed once) to cause precipitation of a white coagulated material (polymer comprising α-methylstyrene units and methyl α-chloroacrylate units). Thereafter, the solution containing the polymer that had precipitated was filtered using a Kiriyama funnel to obtain a white polymer.

Next, the obtained polymer was dissolved in 10 g of THF, and the resultant solution was dripped into 100 g of methanol (MeOH) (i.e., reprecipitation purification of dripping a THF solution into methanol ("reprecipitation purification 2" in Table 1) was performed one more time (5 times in total)) to cause precipitation of a white coagulated material (polymer comprising α-methylstyrene units and methyl α-chloroacrylate units). Thereafter, the solution containing the polymer that had precipitated was filtered using a Kiriyama funnel to obtain a white polymer. The weight-average molecular weight of the polymer, the number-average molecular weight of the polymer, and the molecular weight distribution of the polymer were measured. The results are shown in Table 1.

Example 10

"Production of a polymer" and "production of a resist composition" were performed in the same way as in Example 1 with the exception that "reprecipitation purification 2" was performed 10 times instead of performing "reprecipitation purification 2" twice in "reprecipitation purification of a polymerized product" in Example 1, and "production of a resist composition" was performed as described below. Measurements and evaluations were also performed in the same way as in Example 1. The results are shown in Table 1.
<Production of Resist Composition>

The obtained polymer was dissolved in anisole as a solvent, and then methyl α-chloroacrylate (ACAM) and α-methylstyrene (AMS) were added as monomers such that the content of α-methylstyrene (AMS) relative to the polymer was 1,000 mass ppm and the content of methyl α-chloroacrylate (ACAM) relative to the polymer was 500 mass ppm. A resist solution (positive resist composition) in which the concentration of the polymer was 1 mass % was produced. The results are shown in Table 1.

Example 11

"Production of a polymer" and "production of a resist composition" were performed in the same way as in Example 2 with the exception that "reprecipitation purification 2" was performed 10 times in total (reprecipitation purification 2 performed 9 times, reprecipitation purification 1 subsequently performed once, and then reprecipitation purification 2 performed once) instead of performing "reprecipitation purification 2" 3 times in total (reprecipitation purification 2 performed twice, reprecipitation purification 1 subsequently performed once, and then reprecipitation purification 2 performed once) in "reprecipitation purification of a polymerized product" in Example 2, and "production of a resist composition" was performed as described below. Measurements and evaluations were also performed in the same way as in Example 2. The results are shown in Table 1.
<Production of Resist Composition>

The obtained polymer was dissolved in anisole as a solvent, and then methyl α-chloroacrylate (ACAM) and α-methylstyrene (AMS) were added as monomers such that the content of α-methylstyrene (AMS) relative to the polymer was 1,000 mass ppm and the content of methyl α-chloroacrylate (ACAM) relative to the polymer was 500 mass ppm. A resist solution (positive resist composition) in which the concentration of the polymer was 1 mass % was produced. The results are shown in Table 1.

Example 12

"Production of a polymer" and "production of a resist composition" were performed in the same way as in Example 10 with the exception that "polymerization of a monomer composition" was performed as described below. Measurements and evaluations were also performed in the same way as in Example 10. The results are shown in Table 1.

[Polymerization of Monomer Composition]

A monomer composition (monomer concentration: 17 mass %) containing 10.00 g of methyl methacrylate (MMA) as a monomer, 49.45 g of cyclopentanone (CPN) as a solvent, and 0.0364 g of azobisisobutyronitrile (AIBN) as a polymerization initiator was loaded into a glass container. The glass container was tightly sealed and purged with nitrogen, and was then stirred for 48 hours in a 75° C. thermostatic tank under a nitrogen atmosphere. Thereafter, the glass container was restored to room temperature, the inside of the glass container was opened to the atmosphere, and then 10 g of tetrahydrofuran (THF) was added to the resultant solution. The solution to which 10 g of THF had been added was then dripped into 100 g of methanol to cause precipitation of a polymerized product, and the solution containing the polymerized product that had precipitated was subsequently filtered using a Kiriyama funnel to obtain 7.00 g of a white coagulated material (polymerized product) (i.e., a "precipitation purification operation" in Table 1 was performed once). The obtained polymerized product had a number-average molecular weight (Mn) of 20,000, a weight-average molecular weight (Mw) of 40,000, and a molecular weight distribution (Mw/Mn) of 2.00.

Comparative Example 1

"Production of a polymer" and "production of a resist composition" were performed in the same way as in Example 1 with the exception that "reprecipitation purification of a polymerized product" in Example 1 was not performed. Measurements and evaluations were also performed in the same way as in Example 1. The results are shown in Table 2.

Comparative Example 2

"Production of a polymer" and "production of a resist composition" were performed in the same way as in Example 10 with the exception that α-methylstyrene (AMS) and methyl α-chloroacrylate (ACAM) were not added as monomers in "production of a resist composition" in Example 10. Measurements and evaluations were also performed in the same way as in Example 10. The results are shown in Table 2.

Comparative Example 3

"Production of a polymer" and "production of a resist composition" were performed in the same way as in Example 10 with the exception that, in "production of a resist composition" in Example 10, α-methylstyrene (AMS) and methyl α-chloroacrylate (ACAM) were added as monomers such that the content of α-methylstyrene (AMS) relative to the polymer was 50,000 mass ppm and the content of methyl α-chloroacrylate (ACAM) relative to the polymer was 20,000 mass ppm instead of adding α-methylstyrene (AMS) and methyl α-chloroacrylate (ACAM) as monomers such that the content of α-methylstyrene (AMS) relative to the polymer was 1,000 mass ppm and the content of methyl α-chloroacrylate (ACAM) relative to the polymer was 500 mass ppm. Measurements and evaluations were also performed in the same way as in Example 10. The results are shown in Table 2.

Comparative Example 4

"Production of a polymer" and "production of a resist composition" were performed in the same way as in Example 10 with the exception that, in "production of a resist composition" in Example 10, α-methylstyrene (AMS) and methyl α-chloroacrylate (ACAM) were added as monomers such that the content of α-methylstyrene (AMS) relative to the polymer was 3 mass ppm and the content of methyl α-chloroacrylate (ACAM) relative to the polymer was 3 mass ppm instead of adding α-methylstyrene (AMS) and methyl α-chloroacrylate (ACAM) as monomers such that the content of α-methylstyrene (AMS) relative to the polymer was 1,000 mass ppm and the content of methyl α-chloroacrylate (ACAM) relative to the polymer was 500 mass ppm. Measurements and evaluations were also performed in the same way as in Example 10. The results are shown in Table 2.

Comparative Example 5

"Production of a polymer" and "production of a resist composition" were performed in the same way as in Example 2 with the exception that "reprecipitation purification 2" was performed 10 times in total (reprecipitation purification 2 performed 9 times, reprecipitation purification 1 subsequently performed once, and then reprecipitation purification 2 performed once) instead of performing "reprecipitation purification 2" 3 times in total (reprecipitation purification 2 performed twice, reprecipitation purification 1 subsequently performed once, and then reprecipitation purification 2 performed once) in "reprecipitation purification of a polymerized product" in Example 2. Measurements and evaluations were also performed in the same way as in Example 2. The results are shown in Table 2.

Comparative Example 6

"Production of a polymer" and "production of a resist composition" were performed in the same way as in Example 2 with the exception that "reprecipitation purification 2" was not performed instead of performing "reprecipitation purification 2" 3 times in total (reprecipitation purification 2 performed twice, reprecipitation purification 1 subsequently performed once, and then reprecipitation purification 2 performed once) in "reprecipitation purification of a polymerized product" in Example 2. Measurements and evaluations were also performed in the same way as in Example 2. The results are shown in Table 2.

Comparative Example 7

"Production of a polymer" and "production of a resist composition" were performed in the same way as in Comparative Example 5 with the exception that "production of a resist composition" was performed as described below. Measurements and evaluations were also performed in the same way as in Comparative Example 5. The results are shown in Table 2.

<Production of Resist Composition>

The obtained polymer was dissolved in anisole as a solvent, and then α-methylstyrene (AMS) and methyl α-chloroacrylate (ACAM) were added as monomers such that the content of α-methylstyrene (AMS) relative to the polymer was 50,000 mass ppm and the content of methyl α-chloroacrylate (ACAM) relative to the polymer was 20,000 mass ppm. A resist solution (positive resist composition) in which the concentration of the polymer was 1 mass % was produced. The results are shown in Table 2.

Comparative Example 8

"Production of a polymer" and "production of a resist composition" were performed in the same way as in Example 8 with the exception that "reprecipitation purification 2" was performed twice instead of performing "reprecipitation purification 2" 4 times in "reprecipitation purification of a polymerized product" in Example 8. Measurements and evaluations were also performed in the same way as in Example 8. The results are shown in Table 2.

Comparative Example 9

"Production of a polymer" and "production of a resist composition" were performed in the same way as in Example 12 with the exception that α-methylstyrene (AMS) and methyl α-chloroacrylate (ACAM) were not added as monomers in "production of a resist composition" in Example 12. Measurements and evaluations were also performed in the same way as in Example 12. The results are shown in Table 2.

Comparative Example 10

"Production of a polymer" and "production of a resist composition" were performed in the same way as in Example 12 with the exception that, in "production of a resist composition" in Example 12, α-methylstyrene (AMS) and methyl α-chloroacrylate (ACAM) were added as monomers such that the content of α-methylstyrene (AMS) relative to the polymer was 50,000 mass ppm and the content of methyl α-chloroacrylate (ACAM) relative to the polymer was 20,000 mass ppm instead of adding α-methylstyrene (AMS) and methyl α-chloroacrylate (ACAM) as monomers such that the content of α-methylstyrene (AMS) relative to the polymer was 1,000 mass ppm and the content of methyl α-chloroacrylate (ACAM) relative to the polymer was 500 mass ppm. Measurements and evaluations were also performed in the same way as in Example 12. The results are shown in Table 2.

TABLE 1

| | | Example 1 | Example 2 | Example 3 | Example 4 | Example 5 | Example 6 |
|---|---|---|---|---|---|---|---|
| Polymer (after reprecipitation purification) physical properties | Number-average molecular weight (Mn) | 29000 | 51000 | 46000 | 76000 | 115000 | 125000 |
| | Weight-average molecular weight (Mw) | 55000 | 73000 | 60000 | 99000 | 141000 | 165000 |
| | Molecular weight distribution (Mw/Mn) | 1.85 | 1.43 | 1.30 | 1.30 | 1.22 | 1.32 |
| Residual monomers (after reprecipitation purification) | α-Methylstyrene (AMS) (ppm) | 1927 | 1050 | 676 | 981 | 977 | 3649 |
| | Methyl α-chloroacrylate (ACAM) (ppm) | 1100 | 487 | 91 | 307 | 207 | 532 |
| Charged amount | Methyl α-chloroacrylate (ACAM) (g) | 10.00 | 10.00 | 10.00 | 10.00 | 10.00 | 10.00 |

TABLE 1-continued

| | | | | | | | |
|---|---|---|---|---|---|---|---|
| | Methyl methacrylate (MMA) (g) | — | — | — | — | — | — |
| | α-Methylstyrene (AMS) (g) | 22.93 | 22.93 | 22.93 | 22.93 | 22.93 | 22.93 |
| | Azobisisobutyronitrile (AIBN) (g) | 0.0364 | 0.0364 | 0.0364 | 0.0273 | 0.0091 | 0.0091 |
| | Cyclopentanone (CPN) (g) | 49.45 | 49.45 | 8.25 | 0.00 | 0.00 | 0.00 |
| | Monomer concentration (mass %) | 40 | 40 | 80 | 100 | 100 | 100 |
| Polymerization reaction conditions | Reaction time (hr) | 48 | 48 | 6 | 48 | 8 | 8 |
| | Reaction temperature (° C.) | 75 | 75 | 78 | 75 | 78 | 78 |
| Reprecipitation purification 1 conditions | THF/MeOH | — | 60/40 | 60/40 | 63.5/36.5 | 65.5/34.5 | 66/34 |
| Polymerized product (after precipitation purification operation and before reprecipitation purification) physical properties | Number-average molecular weight (Mn) | 29000 | 29000 | 27000 | 32000 | 39000 | 39000 |
| | Weight-average molecular weight (Mw) | 55000 | 55000 | 45000 | 56000 | 72000 | 72000 |
| | Molecular weight distribution (Mw/Mn) | 1.85 | 1.85 | 1.68 | 1.76 | 1.84 | 1.84 |
| Purification | 1. Repetitions of precipitation purification operation | 1 | 1 | 1 | 1 | 1 | 1 |
| | 1. Additive amount of THF to polymerization solution in precipitation operation (g) | 10 | 10 | 10 | 10 | 10 | 10 |
| | 2. Repetitions of reprecipitation purification 1 | 0 | 1 | 1 | 1 | 1 | 1 |
| | 2. Production of THF solution of 10 mass % in concentration | No | Yes | Yes | Yes | Yes | Yes |
| | 3. Repetitions of reprecipitation purification 2 | 2 | 3 | 1 | 3 | 1 | 1 |
| | Total repetitions of purification (precipitation purification + reprecipitation purification 1 + reprecipitation purification 2) | 3 | 5 | 3 | 5 | 3 | 3 |
| Monomers added after measurement of content of residual monomers (after reprecipitation purification) | α-Methylstyrene (AMS) (ppm) | 0 | 0 | 0 | 0 | 0 | 0 |
| | Methyl α-chloroacrylate (ACAM) (ppm) | 0 | 0 | 0 | 0 | 0 | 0 |
| Evaluation | Coatability (coating film formability) of resist composition | A | A | B | A | A | B |
| | Close adherence of resist film | A | A | B | A | A | B |
| | Bridging defect resistance of resist pattern | A | A | A | A | B | A |
| | Pattern collapse resistance of resist pattern | B | A | B | A | B | A |
| | γ Value of resist pattern (pattern clarity) | B | A | A | B | A | A |

| | | Example 7 | Example 8 | Example 9 | Example 10 | Example 11 | Example 12 |
|---|---|---|---|---|---|---|---|
| Polymer (after reprecipitation purification) physical properties | Number-average molecular weight (Mn) | 18000 | 169000 | 301000 | 29000 | 51000 | 20000 |
| | Weight-average molecular weight (Mw) | 22000 | 342000 | 433000 | 55000 | 73000 | 40000 |
| | Molecular weight distribution (Mw/Mn) | 1.20 | 2.02 | 1.44 | 1.85 | 1.43 | 2.00 |
| Residual monomers (after reprecipitation purification) | α-Methylstyrene (AMS) (ppm) | 26291 | 7561 | 1540 | <5 ppm (undetectable) | <5 ppm (undetectable) | 0 |
| | Methyl α-chloroacrylate (ACAM) (ppm) | 13225 | 1018 | 246 | <5 ppm (undetectable) | <5 ppm (undetectable) | 0 |
| Charged amount | Methyl α-chloroacrylate (ACAM) (g) | 10.00 | Polymer production method (emulsion polymerization) described in Synthesis Example 1 of WO99/62964 | | 10.00 | 10.00 | — |
| | Methyl methacrylate (MMA) (g) | — | | | — | — | 10.00 |
| | α-Methylstyrene (AMS) (g) | 22.93 | | | 22.93 | 22.93 | — |
| | Azobisisobutyronitrile (AIBN) (g) | 0.2909 | | | 0.0364 | 0.0364 | 0.0364 |
| | Cyclopentanone (CPN) (g) | 8.31 | | | 49.45 | 49.45 | 49.45 |
| | Monomer concentration (mass %) | 80 | | | 40 | 40 | 17 |

TABLE 1-continued

| | | | | | | | |
|---|---|---|---|---|---|---|---|
| Polymerization reaction conditions | Reaction time (hr) | 6.5 | | | 48 | 48 | 48 |
| | Reaction temperature (° C.) | 78 | | | 75 | 75 | 75 |
| Reprecipitation purification 1 conditions | THF/MeOH | 50/50 | — | 68.5/31.5 | — | 60/40 | — |
| Polymerized product (after precipitation purification operation and before reprecipitation purification) physical properties | Nunber-average molecular weight (Mn) | 12000 | 169000 | 169000 | 29000 | 29000 | 20000 |
| | Weight-average molecular weight (Mw) | 17000 | 342000 | 342000 | 55000 | 55000 | 40000 |
| | Molecular weight distribution (Mw/Mn) | 1.46 | 2.02 | 2.02 | 1.85 | 1.85 | 2.00 |
| Purification | 1. Repetitions of precipitation purification operation | 1 | 1 | 1 | 1 | 1 | 1 |
| | 1. Additive amount of THF to polymerization solution in precipitation operation (g) | 10 | 66.7 | 10 | 10 | 10 | 10 |
| | 2. Repetitions of reprecipitation purification 1 | 1 | 0 | 1 | 0 | 1 | 0 |
| | 2. Production of THF solution of 10 mass % in concentration | Yes | No | Yes | No | Yes | No |
| | 3. Repetitions of reprecipitation purification 2 | 1 | 4 | 5 | 10 | 10 | 10 |
| | Total repetitions of purification (precipitation purification + reprecipitation purification 1 + reprecipitation purification 2) | 3 | 5 | 7 | 11 | 12 | 11 |
| Monomers added after measurement of content of residual monomers (after reprecipitation purification) | α-Methylstyrene (AMS) (ppm) | 0 | 0 | 0 | 1000 | 1000 | 1000 |
| | Methyl α-chloroacrylate (ACAM) (ppm) | 0 | 0 | 0 | 500 | 500 | 500 |
| Evaluation | Coatability (coating film formability) of resist composition | B | B | A | A | A | A |
| | Close adherence of resist film | B | B | A | A | A | A |
| | Bridging defect resistance of resist pattern | B | A | A | A | A | B |
| | Pattern collapse resistance of resist pattern | B | A | A | A | A | B |
| | γ Value of resist pattern (pattern clarity) | B | A | A | A | A | B |

TABLE 2

| | | Comparative Example 1 | Comparative Example 2 | Comparative Example 3 | Comparative Example 4 | Comparative Example 5 |
|---|---|---|---|---|---|---|
| Polymer (after reprecipitation purification) physical properties | Number-average molecular weight (Mn) | — | 29000 | 29000 | 29000 | 51000 |
| | Weight-average molecular weight (Mw) | — | 55000 | 55000 | 55000 | 73000 |
| | Molecular weight distribution (Mw/Mn) | — | 1.85 | 1.85 | 1.85 | 1.43 |
| Residual monomers (after reprecipitation purification) | α-Methylstyrene (AMS) (ppm) | 45000 | <5 ppm (undetectable) | <5 ppm (undetectable) | <5 ppm (undetectable) | <5 ppm (undetectable) |
| | Methyl α-chloroacrylate (ACAM) (ppm) | 20000 | <5 ppm (undetectable) | <5 ppm (undetectable) | <5 ppm (undetectable) | <5 ppm (undetectable) |
| Charged amount | Methyl α-chloroacrylate (ACAM) (g) | 10.00 | 10.00 | 10.00 | 10.00 | 10.00 |
| | Methyl methacrylate (MMA) (g) | — | — | — | — | — |
| | α-Methylstyrene (AMS) (g) | 22.93 | 22.93 | 22.93 | 22.93 | 22.93 |
| | Azobisisobutyronitrile (AIBN) (g) | 0.0364 | 0.0364 | 0.0364 | 0.0364 | 0.0364 |
| | Cyclopentanone (CPN) (g) | 49.45 | 49.45 | 49.45 | 49.45 | 49.45 |
| | Monomer concentration (mass %) | 40 | 40 | 40 | 40 | 40 |
| Polymerization reaction conditions | Reaction time (hr) | 48 | 48 | 48 | 48 | 48 |
| | Reaction temperature (° C.) | 75 | 75 | 75 | 75 | 75 |
| Reprecipitation purification 1 conditions | THF/MeOH | — | — | — | — | 60/40 |

TABLE 2-continued

| | | | | | | |
|---|---|---|---|---|---|---|
| Polymerized product (after precipitation purification operation and before reprecipitation purification) physical properties | Number-average molecular weight (Mn) | 29000 | 29000 | 29000 | 29000 | 29000 |
| | Weight-average molecular weight (Mw) | 55000 | 55000 | 55000 | 55000 | 55000 |
| | Molecular weight distribution (Mw/Mn) | 1.85 | 1.85 | 1.85 | 1.85 | 1.85 |
| Purification | 1. Repetitions of precipitation purification operation | 1 | 1 | 1 | 1 | 1 |
| | 1. Additive amount of THF to polymerization solution in precipitation operation (g) | 10 | 10 | 10 | 10 | 10 |
| | 2. Repetitions of reprecipitation purification 1 | 0 | 0 | 0 | 0 | 1 |
| | 2. Production of THF solution of 10 mass % in concentration | No | No | No | No | Yes |
| | 3. Repetitions of reprecipitation purification 2 | 0 | 10 | 10 | 10 | 10 |
| | Total repetitions of purification (precipitation purification + reprecipitation purification 1 + reprecipitation purification 2) | 1 | 11 | 11 | 11 | 12 |
| Monomers added after measurement of content of residual monomers (after reprecipitation purification) | α-Methylstyrene (AMS) (ppm) | 0 | 0 | 50000 | 3 | 0 |
| | Methyl α-chloroacrylate (ACAM) (ppm) | 0 | 0 | 20000 | 3 | 0 |
| Evaluation | Coatability (coating film formability) of resist composition | A | C | A | B | C |
| | Close adherence of resist film | A | C | A | B | C |
| | Bridging defect resistance of resist pattern | C | A | C | C | A |
| | Pattern collapse resistance of resist pattern | B | C | C | B | C |
| | γ Value of resist pattern (pattern clarity) | C | A | C | C | A |

| | | Comparative Example 6 | Comparative Example 7 | Comparative Example 8 | Comparative Example 9 | Comparative Example 10 |
|---|---|---|---|---|---|---|
| Polymer (after reprecipitation purification) physical properties | Number-average molecular weight (Mn) | 51000 | 51000 | 169000 | 20000 | 20000 |
| | Weight-average molecular weight (Mw) | 73000 | 73000 | 342000 | 40000 | 40000 |
| | Molecular weight distribution (Mw/Mn) | 1.43 | 1.43 | 2.02 | 2.00 | 2.00 |
| Residual monomers (after reprecipitation purification) | α-Methylstyrene (AMS) (ppm) | 30000 | <5 ppm (undetectable) | 50000 | 0 | 0 |
| | Methyl α-chloroacrylate (ACAM) (ppm) | 16000 | <5 ppm (undetectable) | 20000 | 0 | 0 |
| Charged amount | Methyl α-chloroacrylate (ACAM) (g) | 10.00 | 10.00 | Polymer production method (emulsion polymerization) described in Synthesis Example 1 of WO99/62964 | — | — |
| | Methyl methacrylate (MMA) (g) | — | — | | 10.00 | 10.00 |
| | α-Methylstyrene (AMS) (g) | 22.93 | 22.93 | | — | — |
| | Azobisisobutyronitrile (AIBN) (g) | 0.0364 | 0.0364 | | 0.0364 | 0.0364 |
| | Cyclopentanone (CPN) (g) | 49.45 | 49.45 | | 49.45 | 49.45 |
| | Monomer concentration (mass %) | 40 | 40 | | 17 | 17 |
| Polymerization reaction conditions | Reaction time (hr) | 48 | 48 | | 48 | 48 |
| | Reaction temperature (° C.) | 75 | 75 | | 75 | 75 |
| Reprecipitation purification 1 conditions | THF/MeOH | 60/40 | 60/40 | — | — | — |
| Polymerized product (after precipitation purification operation and before reprecipitation purification) physical | Number-average molecular weight (Mn) | 29000 | 29000 | 169000 | 20000 | 20000 |
| | Weight-average molecular weight (Mw) | 55000 | 55000 | 342000 | 40000 | 40000 |

TABLE 2-continued

| | | | | | | |
|---|---|---|---|---|---|---|
| properties | Molecular weight distribution (Mw/Mn) | 1.85 | 1.85 | 2.02 | 2.00 | 2.00 |
| Purification | 1. Repetitions of precipitation purification operation | 1 | 1 | 1 | 1 | 1 |
| | 1. Additive amount of THF to polymerization solution in precipitation operation (g) | 10 | 10 | 66.7 | 10 | 10 |
| | 2. Repetitions of reprecipitation purification 1 | 1 | 1 | 0 | 0 | 0 |
| | 2. Production of THF solution of 10 mass % in concentration | Yes | Yes | No | No | No |
| | 3. Repetitions of reprecipitation purification 2 | 0 | 10 | 2 | 10 | 10 |
| | Total repetitions of purification (precipitation purification + reprecipitation purification 1 + reprecipitation purification 2) | 2 | 12 | 3 | 11 | 11 |
| Monomers added after measurement of content of residual monomers (after reprecipitation purification) | α-Methylstyrene (AMS) (ppm) | 0 | 50000 | 0 | 0 | 50000 |
| | Methyl α-chloroacrylate (ACAM) (ppm) | 0 | 20000 | 0 | 0 | 20000 |
| Evaluation | Coatability (coating film formability) of resist composition | A | A | C | C | A |
| | Close adherence of resist film | A | A | A | C | A |
| | Bridging defect resistance of resist pattern | C | C | C | B | C |
| | Pattern collapse resistance of resist pattern | C | C | A | C | C |
| | γ Value of resist pattern (pattern clarity) | C | C | C | B | C |

It can be seen from Tables 1 and 2 that the resist compositions of Examples 1 to 12, which each contain a polymer, a solvent, and an aromatic vinyl monomer and have a content of the aromatic vinyl monomer relative to the polymer of not less than 10 mass ppm and not more than 30,000 mass ppm, can improve coatability (coating film formability) with respect to a substrate in spin coating and close adherence of a resist film, and can form a good pattern compared to the resist compositions of Comparative Examples 1 to 10, which do not have a content of an aromatic vinyl monomer relative to a polymer of not less than 10 mass ppm and not more than 30,000 mass ppm.

INDUSTRIAL APPLICABILITY

Through the presently disclosed resist composition, it is possible to improve coatability (coating film formability) with respect to a substrate in spin coating and close adherence of a resist film, and to form a good pattern. Moreover, through the presently disclosed resist film, a good pattern is formed.

The invention claimed is:

1. A resist composition comprising a polymer, a solvent, and an aromatic vinyl monomer, wherein
content of the aromatic vinyl monomer relative to the polymer is not less than 10 mass ppm and less than 7,561 mass ppm.

2. The resist composition according to claim 1, wherein the aromatic vinyl monomer is an α-methylstyrene derivative.

3. The resist composition according to claim 1, further comprising an α-halogeno(meth)acrylic acid ester monomer, wherein
content of the α-halogeno(meth)acrylic acid ester monomer relative to the polymer is not less than 5 mass ppm and not more than 2,000 mass ppm.

4. The resist composition according to claim 1, wherein the polymer includes an α-methylstyrene monomer unit and a methyl α-chloroacrylate monomer unit.

5. A resist film formed on a substrate using the resist composition according to claim 1.

* * * * *